(12) United States Patent
Fogg et al.

(10) Patent No.: US 7,714,547 B2
(45) Date of Patent: May 11, 2010

(54) METHOD AND APPARATUS FOR CONSTANT ON-TIME SWITCH MODE CONVERTERS

(75) Inventors: John Kenneth Fogg, Cary, NC (US); Pankaj Kashikar, Raleigh, NC (US)

(73) Assignee: SEMTECH Corporation, Morrisville, NC (US)

( * ) Notice: Subject to any disclaimer, the term of this patent is extended or adjusted under 35 U.S.C. 154(b) by 32 days.

(21) Appl. No.: 12/188,613

(22) Filed: Aug. 8, 2008

(65) Prior Publication Data

US 2010/0033215 A1 Feb. 11, 2010

(51) Int. Cl.
G05F 1/70 (2006.01)

(52) U.S. Cl. ...................... 323/224; 323/283

(58) Field of Classification Search ........... 323/224, 323/283, 284
See application file for complete search history.

(56) References Cited

U.S. PATENT DOCUMENTS 7,436,158 B2 * 10/2008 Huang et al. ............... 323/224
7,615,973 B2 * 11/2009 Uehara ...................... 323/224

* cited by examiner

Primary Examiner—Shawn Riley
(74) Attorney, Agent, or Firm—Coats & Bennett, P.L.L.C.

(57) ABSTRACT

The teachings presented herein provide a method and apparatus for operating constant on-time DC/DC converters, including pseudo constant on-time variants, with a virtual current-mode slope signal. Use of the slope signal provides, among other advantages and improvements, greater noise immunity and the ability to operate with a wider range of converter output filters. More particularly, incorporating a properly synchronized slope signal into the on-time triggering comparison provides for a maximum slope offset at on-time triggering. Doing so prevent double-pulsing (i.e., erroneous on-time retriggering) and other undesirable behavior of conventional constant on-time DC/DC converters and, as a particular but non-limiting advantage, allows ready and advantageous use of the slope-compensated converter as taught herein with low ESR capacitors in the output filter.

25 Claims, 6 Drawing Sheets

METHOD AND APPARATUS FOR CONSTANT ON-TIME SWITCH MODE CONVERTERS

TECHNICAL FIELD

The present invention generally relates to DC/DC voltage conversion, and in particular relates to voltage conversion using constant on-time switch mode converters.

BACKGROUND

Constant on-time pulse width modulation (PWM) is a standard control topology in power supply design. Constant on-time control configurations are often used for low duty cycle "Buck" converters (voltage step-down) because they provide fast transient response and do not require compensation for control loop stabilization. Constant on-time control is similar to so-called "hysteretic" control in that when the regulated output voltage falls below a reference threshold, a constant-on time DC/DC converter delivers energy to its output load. Unlike a hysteretic DC/DC converter where the amount of energy delivered to the load is set by a second reference voltage, the amount of energy delivered by a constant on-time DC/DC converter is determined by the on-time pulse of the DC/DC converter.

A standard or conventional constant-on control scheme exhibits significant PWM frequency variation, with variation in duty cycle similar to that exhibited in hysteretic control. So-called "pseudo constant on-time" control is a known technique for counteracting such variation. With pseudo constant on-time control, the PWM on-time is set as a function of the input and output voltages, such that the on-time pulse duration is fixed for given input/output voltages. The pseudo constant on-time technique is well known and does a reasonably good job at first order frequency compensation.

One drawback generally attending constant on-time type control is that it requires the feedback signal to the PWM comparator to be in phase with the converter's switching signals. Such synchronization typically is achieved by setting a minimum equivalent series resistance (ESR) value in the converter's output filter capacitor. Thus, operating with low value ESR capacitors generally requires additional external filter components, which is undesirable in terms of cost, space, and complexity.

SUMMARY

The teachings presented herein provide a method and apparatus for operating constant on-time DC/DC converters, including pseudo constant on-time variants, with a virtual current-mode slope signal. Use of the slope signal provides, among other advantages and improvements, greater noise immunity and the ability to operate with a wider range of converter output filters. The increased noise immunity prevents double-pulsing (i.e., erroneous on-time retriggering) and other undesirable behavior of conventional constant on-time DC/DC converters and, as a particular but non-limiting advantage, allows ready and advantageous use of the slope-compensated converter as taught herein with low ESR capacitors in the output filter.

In one or more embodiments, a constant on-time DC/DC converter comprises a regulation circuit, a combining circuit, and a slope generator circuit. These and additional, optional elements of the DC/DC converter may be implemented as an integrated circuit, which may or may not include high/low side transistor drive circuits, high/low side transistors, output filter elements, etc. Regardless, in one or more embodiments, the regulation circuit includes a comparator configured to trigger on-time switching of the DC/DC converter based on comparing an error signal with a slope signal. Correspondingly, the combining circuit is configured to generate the error signal based on an output feedback signal of the DC/DC converter and a regulation reference signal, and the slope generator circuit is configured to generate the slope signal as a periodic signal that is synchronized with switching cycles of the DC/DC converter and ramps from a peak offset to minimum offset during each cycle.

In another embodiment, a method of operating a constant on-time DC/DC converter comprises triggering on-time switching of the DC/DC converter based on comparing an error signal with a slope signal, and generating the error signal based on an output feedback signal of the DC/DC converter and a regulation reference signal. The method further includes generating the slope signal as a periodic signal that is synchronized with switching cycles of the DC/DC converter and that ramps from a peak offset to minimum offset during each cycle.

The method is, as a non-limiting example, implemented in a hardware circuit, which may include a mix of digital logic circuits and analog amplifiers and comparators. In another example, the method is implemented at least in part in a controller included within the circuitry comprising the DC/DC converter. The controller comprises discrete digital logic circuits in one embodiment, while in other embodiments it comprises integrated processing logic in the form of a microcontroller/microprocessor, ASIC, or other integrated circuit logic. For microprocessor-based embodiments, firmware and/or software instructions are stored in a computer-readable medium, such as EEPROM, FLASH, or other memory device or element, and implementation of the method is based on one or more digital processing circuits executing the stored computer program instructions.

Of course, the present invention is not limited to the above summary of features and advantages. Indeed, those skilled in the art will recognize additional features and advantages upon reading the following detailed description, and upon viewing the accompanying drawings.

DETAILED DESCRIPTION

Figure 1:
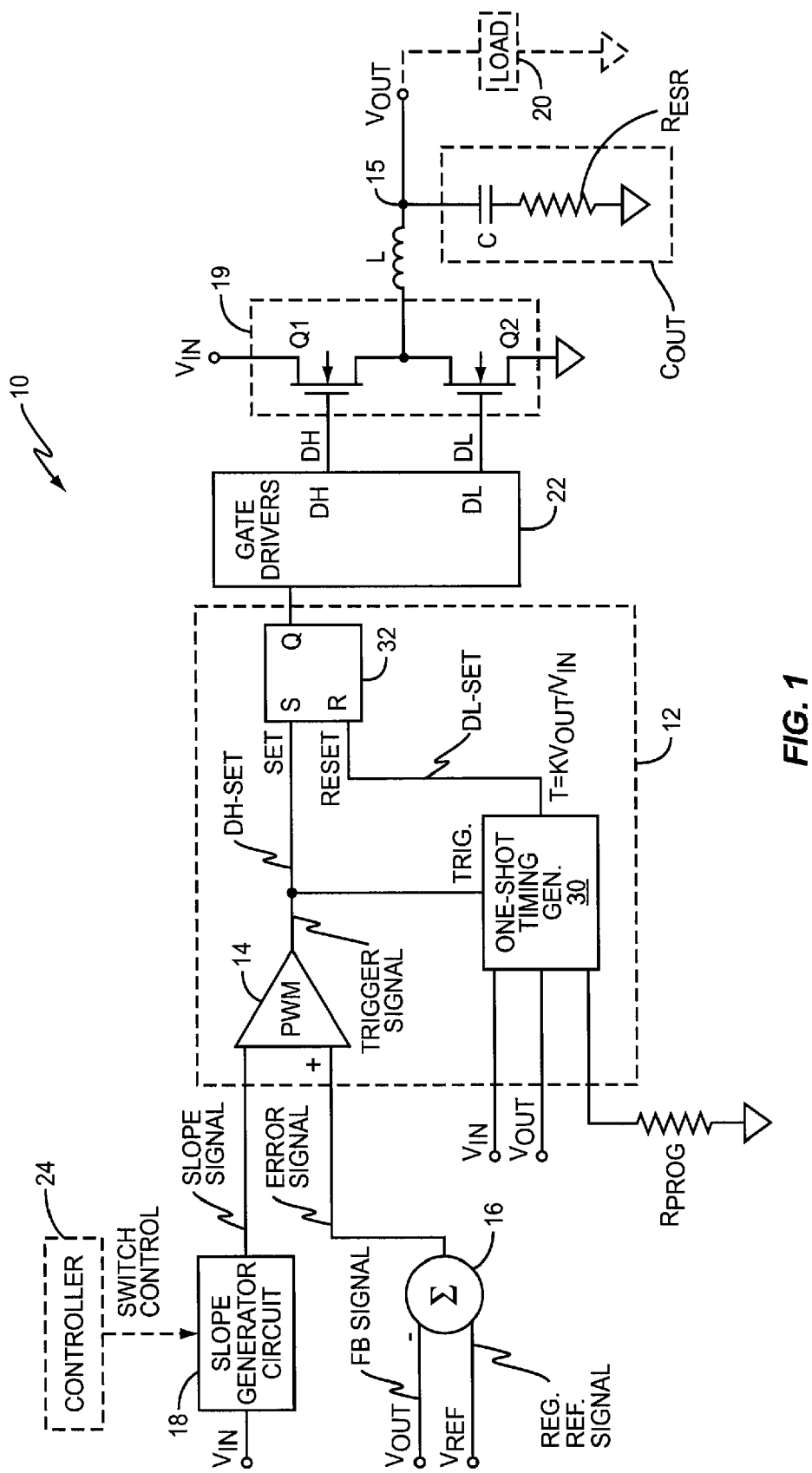
FIG. 1 is block diagram of one embodiment of a constant on-time DC/DC converter configured to use slope compensation as taught herein.

FIG. 1 is a simplified block diagram of a constant on-time DC/DC converter 10, which may be a pseudo constant on-time device that varies on-time with changing input/output voltages, etc. For convenience, the constant on-time DC/DC converter 10, which may comprise an integrated circuit (IC) device, is simply referred to as the DC/DC converter 10 for the remainder of this description.

As will be understood by those of skill in the art, the DC/DC converter 10 is operative to provide a regulated DC output voltage $V_{OUT}$ that is derived from a DC input supply voltage $V_{IN}$. Supporting such operation, the illustrated DC/DC converter 10 comprises a regulation circuit 12, including a comparator 14 that is configured to trigger on-time switching of the DC/DC converter 10 based on comparing an error signal with a slope signal. As will be detailed in the following discussion, the slope signal provides an offset between the signals used in the triggering comparison that, among other advantages, provide noise immunity to the on-time triggering function, which is particularly helpful when low-ESR capacitors are used at the output the DC/DC converter 10, i.e., at the output node 15 where it is common practice to provide an output shunt capacitor $G_{OUT}$.

The DC/DC converter 10 further comprises a combining circuit 16 that is configured to generate the error signal based on an output feedback signal of the DC/DC converter and a regulation reference signal, and a slope generator circuit 18 that is configured to generate the slope signal as a periodic signal that is synchronized with switching cycles of the DC/DC converter 10 and ramps from a peak offset to minimum offset during each cycle. Preferably, the slope signal ramps from the peak offset to the minimum offset over each switching cycle of the DC/DC converter 10. A switching cycle comprises one on/off cycle of the DC/DC converter 10, and the slope signal is generated in one or more embodiments such that it has its maximum value at or substantially coincident with the DC/DC converter switching on, i.e., turning on the high-side transistor Q1 in its output bridge circuit 19. Further, the slope signal preferably ramps down linearly from that maximum offset to a minimum offset (e.g., a zero offset voltage) at the point during the off time of a switching cycle of the DC/DC converter 10 at which the output feedback signal just reaches the regulation reference signal.

For example, in a buck-mode configuration, $V_{OUT}$ is less than $V_{IN}$ and is regulated to a level at or proportional to a voltage set by the regulation reference signal. During the on-time state, the high-side transistor Q1 is on and the low-side transistor Q2 is off, and the DC/DC converter 10 delivers energy to the load 20 through the output inductor L. The output voltage $V_{OUT}$ ramps upward and the output feedback signal rises above the regulation reference signal. The DC/DC converter 10 remains in the on-time state for a defined time duration, hence the name "constant on-time." Conversely, during the off-time state, the high-side transistor Q1 is off and the low-side transistor Q2 is on. During this off-time state, $V_{OUT}$ declines and the output feedback signal correspondingly falls toward the regulation reference signal. When the output feedback signal reaches the regulation reference signal, a new cycle is triggered and the DC/DC converter switches on again.

In support of such operation, the DC/DC converter 10 includes or is associated with a gate driver circuit 22, for generating the drive signals needed to turn the Q1/Q2 transistors on and off in the bridge circuit 19. Further, the DC/DC converter 10 may include a controller 24. In more sophisticated embodiments, the controller 24 may comprise a microcontroller or other digital processing circuit that provides overall control of the DC/DC converter 10, and which may provide for control and/or monitoring by other circuitry within a system that incorporates the DC/DC converter 10. (As a non-limiting example, the DC/DC converter 10 may be implemented within a cellular phone or other portable electronic device, or may be used to provide regulated power to one or more microprocessor cores in a computer. In such cases, the controller 24 may include various supervisory, monitoring, and control connections, which allow the DC/DC converter 10 to work in concert with the larger system.)

Of course, those skilled in the art will appreciate that the DC/DC converter 10 is not limited to such applications, and that such uses are not particularly germane to understanding the slope compensation improvements embodied in the DC/DC converter 10. Regarding operations related to slope-compensation details, the illustrated regulation circuit 12 includes, in addition to the Pulse Width Modulation (PWM) comparator 14 described earlier, a one-shot timing circuit 30 that is configured to switch the DC/DC converter 10 on for a time duration dependent on a ratio of output to input voltage for the DC/DC converter.

The one-shot timing circuit 30 switches on for its defined time duration in response to being triggered by the comparator. For the example embodiment illustrated, the comparator 14 is configured such that its output signal, SET, goes high if the slope signal falls to a value at or below the error signal (within any comparison precision limitations of the comparator 14). The SET signal going high triggers the one-shot timing circuit 30, which initiates its one-shot timing operation. The rising edge of the SET signal also "sets" an S-R flip flop 32, such that its Q output is asserted, which in turn causes the driver circuit 22 to turn on the high-side transistor Q1 and turn off the low-side transistor Q2 (which both may be FETs). At the conclusion of the one-shot timing pulse (e.g., on-time pulse duration=$KV_{OUT}/V_{IN}$, where K is a desired proportionality constant), the rising (or falling) edge of a RESET signal output by the one-shot timing circuit 30 causes the S-R flip flop 32 to reset, which in turn causes the driver circuit 22 to turn off the high-side transistor Q1 and turn on the low-side transistor Q2.

In more detail, one or more embodiments of the one-shot timing circuit 30 are configured to start (trigger) on the rising edge of the set signal, DH_Set, which is also referred to simply as SET. The one-shot pulse timing is proportional to an external frequency setting resistor, labeled as $R_{PROG}$ in the diagram, and the output voltage $V_{OUT}$, and is inversely proportional to the input supply voltage $V_{IN}$. When the one-shot timing circuit 30 times out, the S-R flip flop 32 is reset, the high side switch Q1 turns off, the low side switch Q2 turns on, and the inductor current $I_L$ circulates through the low side switch Q2 until the output feedback signal falls below the regulation reference signal (e.g., $V_{OUT} < V_{REF}$ again). The result of controlling the on time in this manner is that the resulting frequency of the DC/DC converter 10 is roughly constant under steady state conditions.

Figure 2:
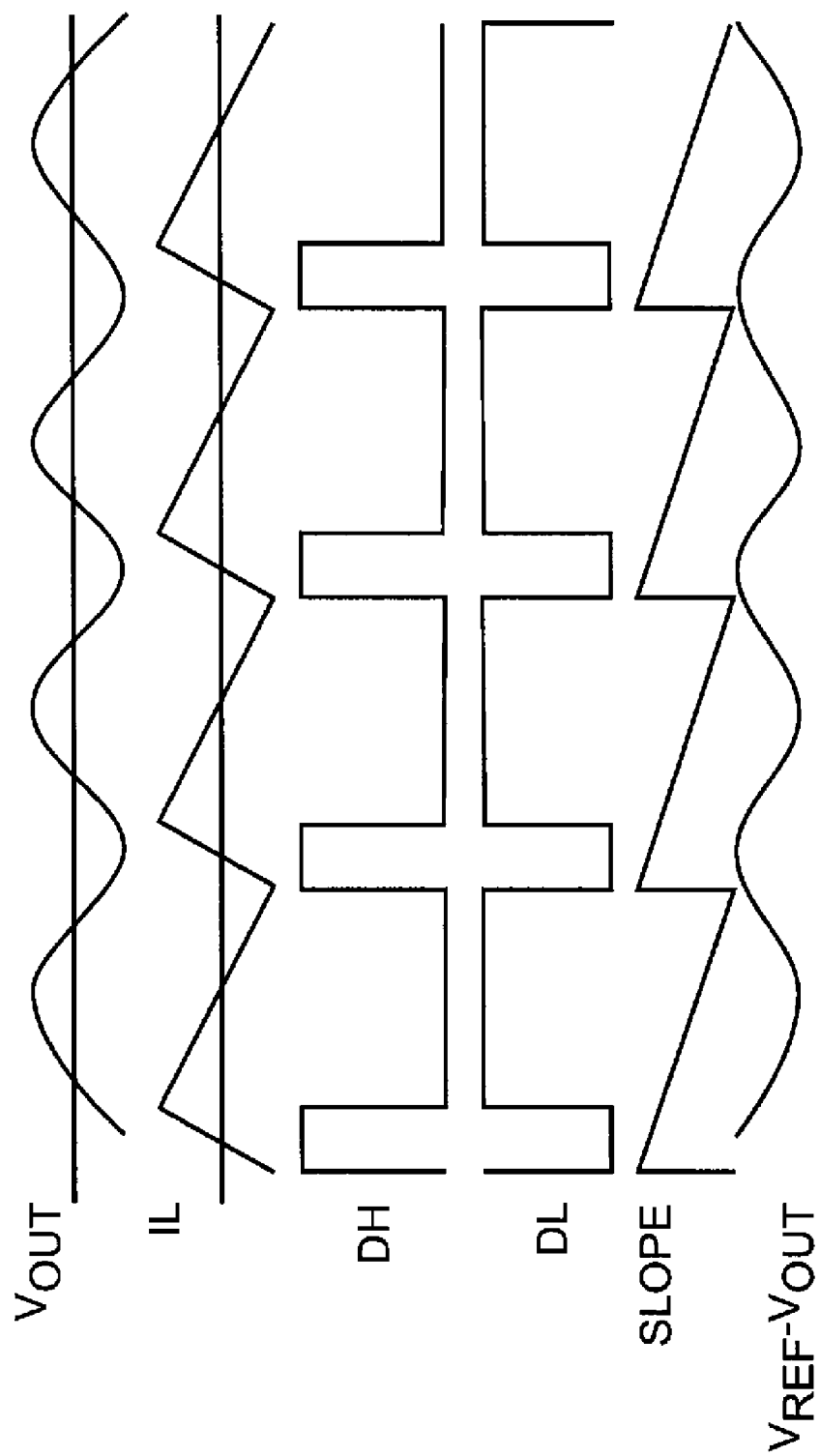
FIG. 2 is a waveform diagram of switching and control waveforms associated with operation of the DC/DC converter of FIG. 1.

Further, with advantageous slope generation as taught herein, triggering of the one-shot timing circuit 30 is made more reliable and much less sensitive to phase shifting of the output feedback signal arising from capacitive filtering at the output 15. FIG. 2 illustrates one example of phase shifting of the output voltage $V_{OUT}$ (and, hence, of the output feedback signal) in relation to inductor current in the output inductor L associated with the DC/DC converter 10. FIG. 2 further illustrates additional timing and control waveforms of the DC/DC converter 10, for context in illustrating advantageous slope signal generation.

Referring to FIG. 2, one sees that, according to the method taught herein, a virtual current slope is added to or otherwise used with the signals presented to the PWM comparator 14, which, in one or more embodiments, compares an error voltage generated as $V_{OUT} - V_{REF}$, with a slope signal. The diagrammed $V_{OUT}$ is depicted for an output capacitance with no ESR and shows the theoretical 90 degree phase shift relative to the ripple current $I_L$ in the output inductor L. The inductor ripple current is shown in the $I_L$ waveform. The DH and DL signals are the gate drive waveforms, as controlled by the regulator circuit 12. The error voltage and slope signal are also shown.

The large signal behavior of the slope-compensated control taught herein is the same as a conventional on-time DC/DC converter in the sense that the high side switch Q1 will be turned on for a calculated on-time whenever the output feedback signal is less than the regulation reference signal, e.g., when $V_{OUT}<V_{REF}$. (Broadly, the output feedback signal simply may be the output voltage as fed back to the combining circuit 16, or a divided-down version may be used, and $V_{REF}$ is a voltage-mode version of the regulation reference signal, with its value set at or in proportion to the desired value of $V_{OUT}$.) Advantageously, however, the small signal behavior of the DC/DC converter 10 is much improved as compared to a conventional implementation.

In particular, the slope signal is created to represent the off-time slope of the inductor current, $I_L$, which is in-phase with the switching cycles of the DC/DC converter 10. The comparator 14 generates a new on-time when the error voltage is greater than the slope signal. This improvement allows the regulator circuit 12 to avoid double pulsing due to the output voltage phase shift, and further improves the frequency stability of the DC/DC converter 10 over line and load variations.

In accordance with this improvement, one further sees that the slope signal is at its maximum offset (ramp peak) coincident with on-time switching of the DC/DC converter 10 (DL going high), and is at its minimum offset (ramp minimum) coincident with the point at which the DC/DC converter 10 switches back on. In other words, the slope signal is generated with a slope that causes it to fall back to its minimum (e.g., zero value) at a time that is coincident (e.g., substantially coincident) with the time at which the output feedback signal just meets (falls to or rises to) the regulation reference signal. In this manner, the slope signal does not alter the on-off timing or output voltage regulation of the DC/DC converter 10, but does provide for advantageous noise immunity at the initiation of the converter's on time state in each switching cycle.

Figure 3:
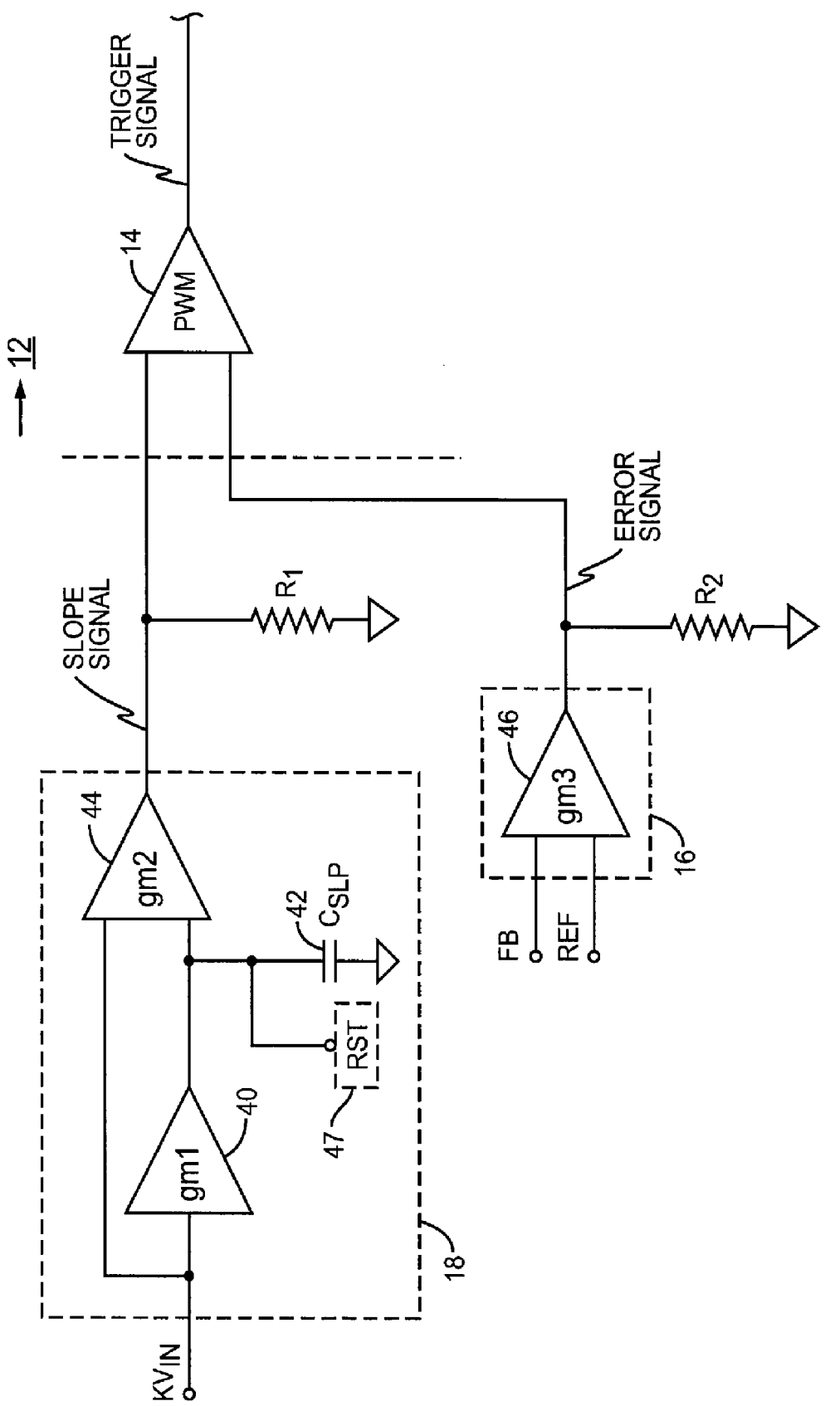
FIG. 3 is a block diagram for one embodiment of a slope generator circuit, such as may be used for slope compensation of a constant on-time DC/DC converter.

FIG. 3 illustrates example details for one embodiment of the slope generator circuit 18, wherein the slope generator circuit 18 comprises a transconductance circuit 40 configured to generate the slope signal by charging and discharging a slope setting capacitor 42 in synchronization with the switching cycles of the DC/DC converter. In particular, in the illustrated embodiment, the first transconductance circuit 40, e.g., a transconductance amplifier, operates as a constant current source that outputs a charging current proportional to the input supply voltage $V_{IN}$ of the DC/DC converter 10 (Here, the charging current equals $K \times gm1 \times V_{IN}$, where gm1 is a transconductance gain value). That charging current charges the slope setting capacitor 42 (also labeled as $C_{SLP}$), which produces a linearly ramping voltage $V_{CSLP}$ at one input to a second transconductance circuit 44, which also may be a transconductance amplifier, but operating with a transconductance gain gm2. The second transconductance circuit thus generates an output current proportional to the voltage difference between its first input (at $K \times V_{IN}$) and its second input at $V_{CSLP}$. Thus, the slope signal is generated as a voltage-mode ramp signal by placing a resistive load $R_1$ on the output of the second transconductance circuit 44.

If $V_{CSLP}$ is zero or some minimum value at the beginning of a switching cycle of the DC/DC converter 10, one sees that the voltage difference between $KV_{IN}$ and $V_{CSLP}$ and the voltage on $R_1$ is at a maximum. The voltage difference linearly declines over the switching cycle, as the slope setting capacitor 42 charges and $V_{CSLP}$ correspondingly rises in linear fashion, reducing the voltage on $R_1$. Therefore, the current output by the second tranconductance circuit 44 is at a maximum at the beginning of the switching cycle, and linearly declines over the duration of the switching cycle. $KV_{IN}$, gm1, gm2, gm3 and $C_{SLP}$ are all scaled relative to the operating frequency $F_{SW}$ of the DC/DC converter 10, so that $V_{CSLP}=KV_{IN}$ when charged for one switching cycle ($T=1/F_{SW}$). Such operation produces the desired maximum offset value of the slope signal at the beginning of the switching cycle and the desired minimum offset value at the end of the switching cycle.

Thus, in at least one embodiment, the slope generator circuit 18 comprises a first transconductance circuit 40 that is configured to charge a slope setting capacitor 42 at a rate proportional to an input supply voltage ($V_{IN}$) of the DC/DC converter 10, and a second transconductance circuit 44 that is configured to generate the slope signal responsive to a voltage of the slope setting capacitor 42. Complementing such operation, the combining circuit 16 may comprise a third transconductance circuit 46 that is configured to generate the error signal proportional to a difference between the output feedback signal and the regulation reference signal. It should also be noted that the slope generator circuit 18 may, in one or more embodiments, include a reset circuit 47 that is configured to discharge the slope setting capacitor 42 in synchronization with on-time switching of the DC/DC converter.

For example, the reset circuit 47 may comprise a switch or other selectively connected load that discharges the slope setting capacitor 42 at the end of each switching cycle. A corresponding method of operation thus entails resetting or otherwise discharging the slope setting capacitor 42 in synchronization with on-time switching of the DC/DC converter 10 via the reset circuit 47. Of course, the charging/discharging sense can be reversed without alteration of the fundamentals of slope signal generation.

Also, as noted, achieving the desired minimum value of the slope signal with the appropriate timing may be achieved by setting the slope setting capacitor's charging rate in proportion to the input supply voltage $V_{IN}$. Thus, in one or more embodiments, the slope generator circuit 18 is configured to charge the slope setting capacitor 42 with a constant current that is proportional to the input supply voltage $V_{IN}$ of the DC/DC converter 10. More broadly, the slope generator circuit 18 in one or more embodiments generates the slope signal proportional to one of the input supply voltage $V_{IN}$ of the DC/DC converter 10, inductor current in the switched inductor L at the output 15 of the DC/DC converter 10, or an output current of the DC/DC converter 10, e.g., the current into the load 20.

Also, in a broad sense, those skilled in the art will recognize from the example explanations immediately above, that the slope generator circuit 18 in one or more embodiments is configured to generate the slope signal as a ramp current or voltage that tracks the off-time slope of switched inductor current for the DC/DC converter 10. (A negative-going ramp is illustrated in FIG. 2, but positive-going ramps may be used in other topologies or configurations of the DC/DC converter 10. Moreover, the overall positive/negative sense of the example signals can be modified without departing from the fundamental operation intended by the teachings herein.)

The above-described DC/DC converter 10 and variations of it thus can be used to implement a method of operating a constant on-time DC/DC converter, including triggering on-time switching of the DC/DC converter based on comparing an error signal with a slope signal, generating the error signal based on an output feedback signal of the DC/DC converter and a regulation reference signal, and generating the slope signal as a periodic signal that is synchronized with switching cycles of the DC/DC converter and that ramps from a peak offset to minimum offset during each cycle. Of course, the method may include any one or more of the variations described thus far for the DC/DC converter 10, such as generating the slope signal via a constant charging current that is proportional to an input supply voltage of the DC/DC converter 10. More particularly, the method may include generating the slope signal by charging and discharging a slope setting capacitor in synchronization with the switching cycles of the DC/DC converter, wherein the slope setting capacitor may be charged with a constant charging current that is proportional to the input supply voltage of the DC/DC converter. Again, in a broad sense, the method includes generating the slope signal as a ramp current or voltage that tracks the off-time slope of switched inductor current for the DC/DC converter, wherein one or more transconductance circuits may be used as described for FIG. 3, for example.

Figure 4:
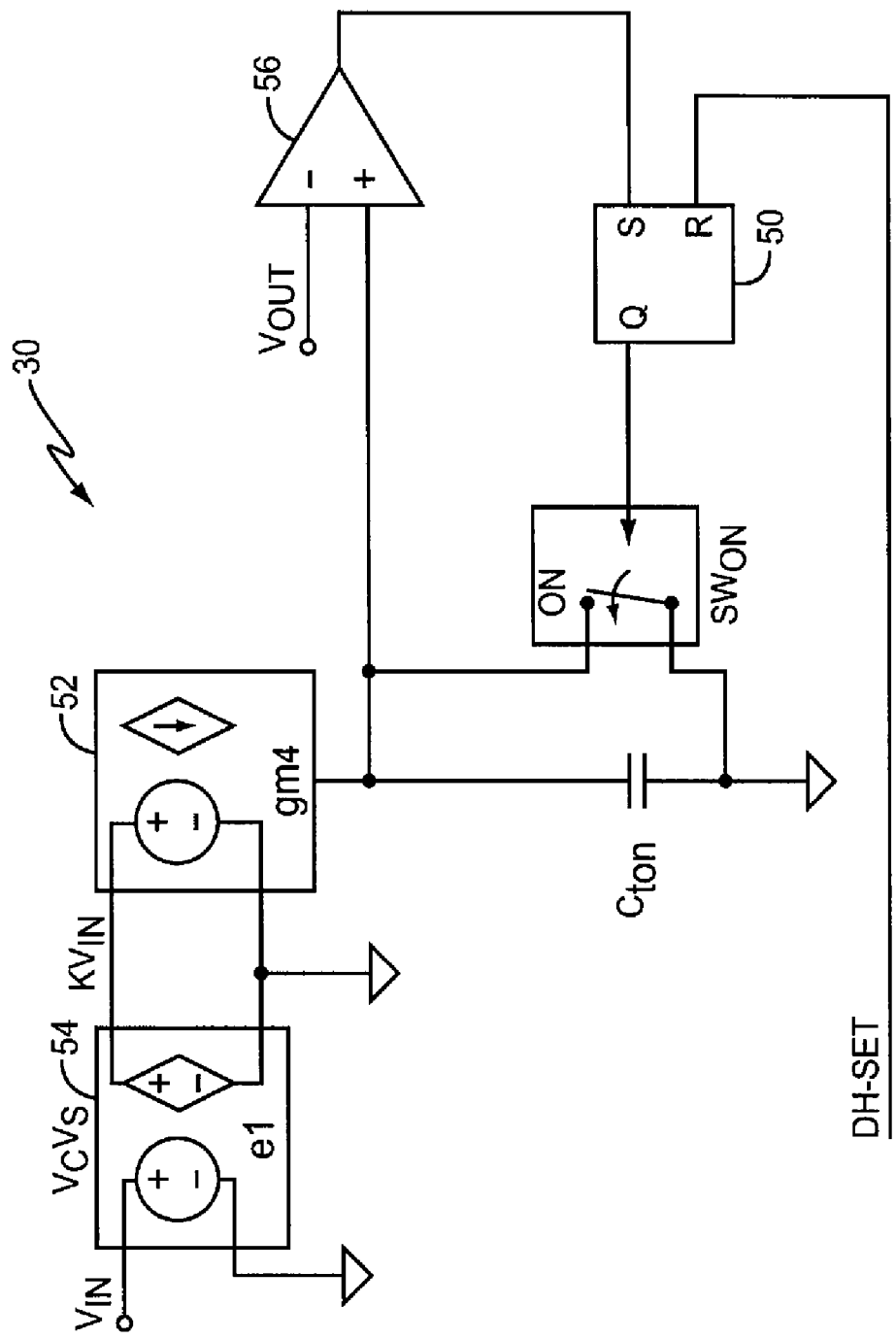
FIG. 4 is a block diagram of a one-shot timing circuit, as may be used in constant on-time control.

Before turning to another embodiment of the slope generator circuit 18, it is helpful to discuss operation of an example implementation of the one-shot timing circuit 30, as shown in FIG. 4. The illustrated embodiment is configured for pseudo fixed frequency operation, but that configuration is not required to practice the teachings presented herein.

In operation, the one-shot timing circuit 30 receives the output DH_SET from the PWM comparator 14 (as shown in FIG. 1). During the off-time of the output bridge 19 (also shown in FIG. 1), DL is high and the low-side switch Q2 is on. The output voltage falls due to the falling slope of the ripple current. During this time the switch SW$_{ON}$ in FIG. 4 is in its on position and the one-shot capacitor C$_{ton}$ is discharged (as controlled via the output signal Q from a SR flip flop 50). When the comparator 14 (see FIG. 1) asserts the DH_SET signal (e.g., when the output feedback signal is less than the regulation reference signal), switch SW$_{ON}$ opens (responsive to the Q signal from the SR flip flop 50) and the on-time capacitor C$_{ton}$ charges until V(C$_{ton}$)>V$_{OUT}$. Such charging is controlled by a transconductance circuit 52, e.g., a transconductance amplifier, which is configured to output a constant current of magnitude K×gm4×V$_{IN}$, where gm4 is a desired transconductance gain. A voltage amplifier 54 may be configured to provide KV$_{IN}$ for this and other uses.

In any case, when V(C$_{ton}$) reaches V$_{OUT}$, an on-time comparator 56 trips, which sets the on-time S-R flip flop 50, thereby discharging the timing capacitor C$_{ton}$. The equation for the on-time T$_{on}$ is $$T_{on} = \frac{C_{ton}}{K \cdot gm4} \cdot \left(\frac{V_{OUT}}{V_{IN}}\right), \text{ and the period is} \quad \text{Eq. (1)}$$

$$Period = \frac{C_{ton}}{K \cdot gm4}. \quad \text{Eq. (2)}$$

These equations illustrate that the on-time is directly proportional to V$_{OUT}$/V$_{IN}$, and the design parameters C$_{ton}$, K, and gm4. These parameters can either be fixed inside the DC/DC converter 10 (e.g., within an IC implementation of the converter) or be adjustable to allow for programmable frequency. The equations are proportional to the steady state on-time for a buck converter, meaning that the DC/DC converter 10 can operate with fixed frequency under steady state conditions, if implemented with this type of one-shot timing circuit 30.

Figure 5:
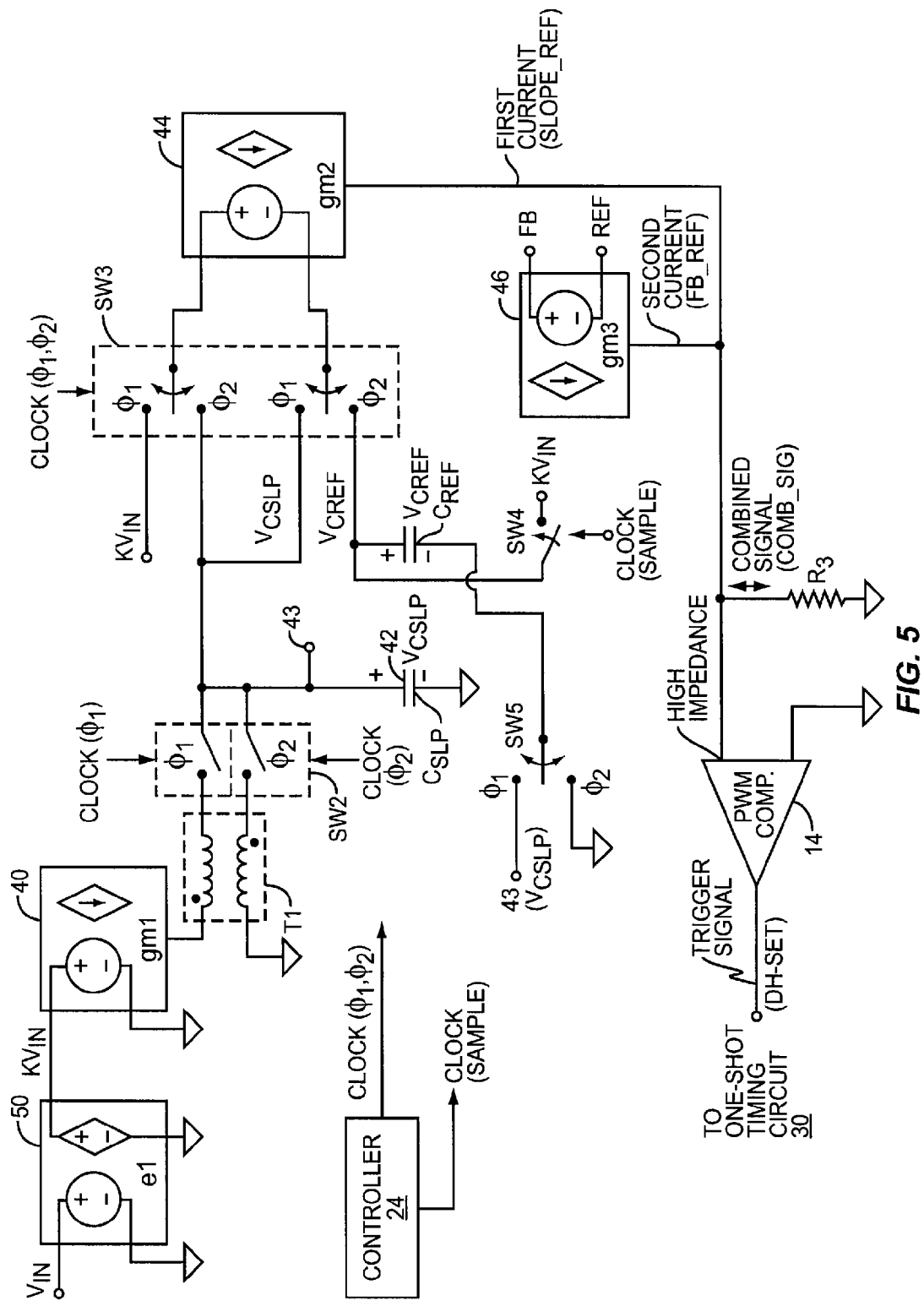
FIG. 5 is a block diagram for another embodiment of a slope generator circuit.

Now turning to another embodiment of the DC/DC converter, which may use an embodiment of the one-shot timing circuit 30 as just described, FIG. 5 illustrates a multi-phase implementation that relies on multi-phase clock signal generation. The controller 24 may, for example, be configured to provide clock signals φ1 and φ2, as non-overlapping clock signals.

The illustrated embodiment provides for a method of operation wherein the slope signal is modified by the switching history of the DC/DC converter using a reference capacitor C$_{REF}$, which stores charge remaining on the slope setting capacitor 42 in a prior switching cycle, for use in incrementally adjusting a relative offset of the slope signal. The method includes triggering the on-time switching of the DC/DC converter 10 by comparing a combined signal, e.g., taken at or across resistor R3, to a given reference signal, shown as a ground reference at the comparator 14, and correspondingly triggering the one-shot timer 30 responsive to the combined signal falling below the given reference signal. As before, the one-shot timing circuit 30, also referred to as a one-shot timer, controls the on time of the DC/DC converter 10.

As seen, generating the combined signal may be based on summing first and second currents. The first current is generated in a first switching phase (clock φ1) proportional to the difference between a voltage proportional to the input supply voltage of the constant on-time DC/DC converter (KV$_{IN}$) and the slope setting capacitor voltage V$_{CSLP}$ of the slope setting capacitor 42. In a second switching phase (clock φ2), the first current is generated proportional to the difference between the slope setting capacitor voltage V$_{CSLP}$ and an output reference capacitor voltage V$_{CREF}$ of the output reference voltage capacitor C$_{REF}$. The second current is generated in the first and second switching phases proportional to the difference between the output feedback signal and the regulation reference signal, e.g., proportional to V$_{OUT}$-V$_{REF}$. Thus, φ1 and φ2 are non-overlapping clocks based on the output switching cycles that are used to define states of the charging current and slope reference voltage.

With this arrangement, one sees that the PWM comparator 14 is driven by the "standard" feedback versus reference comparison, but is advantageously compensated by the slope signal, which is generated by charging/discharging C$_{SLP}$ (capacitor 42) with a constant charging current having the magnitude K×gm1×V$_{IN}$. (The charging current is constant for a given value of V$_{IN}$.) The first current signal, which may be denoted as a SLOPE_REF signal, and the second current, which may be denoted as a FB_REF signal, are respectively generated by the transconductance circuits 44 and 46, and summed via the resistor R3, to generate the combined signal, which may be denoted as COMB_SIG. The PWM comparator 14 takes the combined signal on one input node (which is high impedance), and takes a reference signal, shown as signal ground in FIG. 5.

To better understand such operation, one may assume that at time zero, the illustrated circuit starts in the φ1 phase. The capacitor C$_{SLP}$ is charged with current K×gm1×V$_{IN}$ from 0V, wherein the transconductance circuit 40 may be configured to output that current based on receiving KV$_{IN}$ from a voltage amplifier 50. In any case, the first current equal to I$_1$=(KV$_{IN}$-V$_{CSLP}$)gm2 is sourced into the summing resistor R3. The second current equal to I$_2$=(FB-REF)gm3 is also sourced into the summing resistor R3 (where this usage of FB and REF connote voltage signals). When the resulting voltage signal, referred to as the combined signal or COMB_SIG, is less than ground, the PWM comparator 14 trips and starts the next output on-time of the DC/DC converter 10. Ideally this trip point occurs when ($V_{CSLP}=KV_{IN}$) and (FB=REF) to preserve accurate voltage regulation.

Tripping at this ideal point occurs when $$T_{SLP} = \frac{C_{SLP} \cdot K \cdot V_{IN}}{K \cdot V_{IN} \cdot gm1} = \frac{C_{SLP}}{gm1}, \qquad \text{Eq. (3)}$$

where $T_{SLP}$ is the max-to-min ramp time of the slope signal. In other words, the ideal trip point for on-time switching of the DC/DC converter 10 is achieved when the period of the slope signal is equal to the switching period of the DC/DC converter 10, i.e., when $$T_{SLP}=T_{F_{SW}} \qquad \text{Eq. (4)}$$

where $T_{SLP}$ denotes the period of the slope signal, and $T_{F_{SW}}$ denotes the switching period of the DC/DC converter 10 for the given switching frequency $F_{SW}$.

The constant on-time DC/DC converter 10 does not control its switching frequency directly. Rather, it controls on-time, which is proportional to its switching frequency in steady state operation. That is, the on-time $T_{ON}$ is given functionally as $$T_{ON} = D(1/F_{SW}) = C_{ton}\left(\frac{V_{OUT}}{KV_{IN} \cdot gm4}\right) \text{ and} \qquad \text{Eq. (5)}$$

$$(1/F_{SW}) = \frac{C_{ton}}{K \cdot gm4} \text{ and} \qquad \text{Eq. (6)}$$

$$\frac{C_{ton}}{K \cdot gm4} = \frac{C_{SLP}}{gm1} \qquad \text{Eq. (7)}$$

Satisfying the above equations is sufficient for basic operation of the DC/DC converter 10, wherein the added slope compensation improves reliability of switching but does not alter nominal switching times/frequencies as compared to a conventionally-implemented constant on-time DC/DC converter. However, additional improvements in accuracy are achieved by using the multi-phase embodiment illustrated in FIG. 5.

In more detail, when the PWM comparator 14 trips at the end of a first modulation cycle, the state clock also changes from φ1 to φ2. (As noted, the controller 24 may generate the state clocks with the appropriate phasing.) This clock change causes the switch S2 to switch from its φ1 connection state to its φ2 connection state. That connection change means that the capacitor 42 stops charging through one leg of the transformer T1, and begins discharging through the other leg of T1. The charging current magnitude is $Kgm1V_{IN}$, and the discharging current may be controlled to be the same magnitude. (The discharging leg of T1 may be ground terminated or may terminate in a current sink to control discharge current magnitude.)

Further, with the φ1-to-φ2 clock change, the difference voltage between $V_{CSLP}$ and $KV_{IN}$ is stored on the Cref capacitor and the inputs to the transconductance circuit 44 are switched from $KV_{IN}$ and $V_{CSLP}$ to $V_{CSLP}$ and $V_{CREF}$. For this second, subsequent switching cycle of the DC/DC converter 10, the slope setting capacitor 42 is discharged from $KV_{IN}$ to $V_{CREF}$, at which point the on-time switching decision occurs. At the end of the φ1 phase, the voltage $V_{CSLP}$ on the slope setting capacitor $C_{SLP}$ is stored on the output reference capacitor $C_{REF}$, for use in the next φ2, φ1 switching phase. Thus, during the φ1 clock phase, gm2 (transconductance circuit 44) has the voltage input ($KV_{IN}-V_{CSLP}$). At the end of the φ1 clock phase, the residual gm2 voltage input ($KV_{IN}-V_{CSLP}$) is sampled onto the capacitor Cref. During the φ2 clock phase, gm2 has the voltage input ($V_{CSLP}-V_{CREF}$) This configuration of the DC/DC converter 10 and the corresponding method of operating the DC/DC converter 10 correct for variations in the analog circuitry by adding a "memory" component associated with the previous switching cycle. The memory feature allows the generated slope signal to represent current changes in the output.

As a further improvement, the tranconductance gain gm3 of the transconductance circuit 46 is set higher than the transconductance gain gm2 of the transconductance circuit 44. That setting ensures that the DC/DC converter 10 in operation will settle to the desired regulation value and will regulate the output voltage $V_{OUT}$ more accurately to the reference voltage $V_{REF}$.

Figure 6:
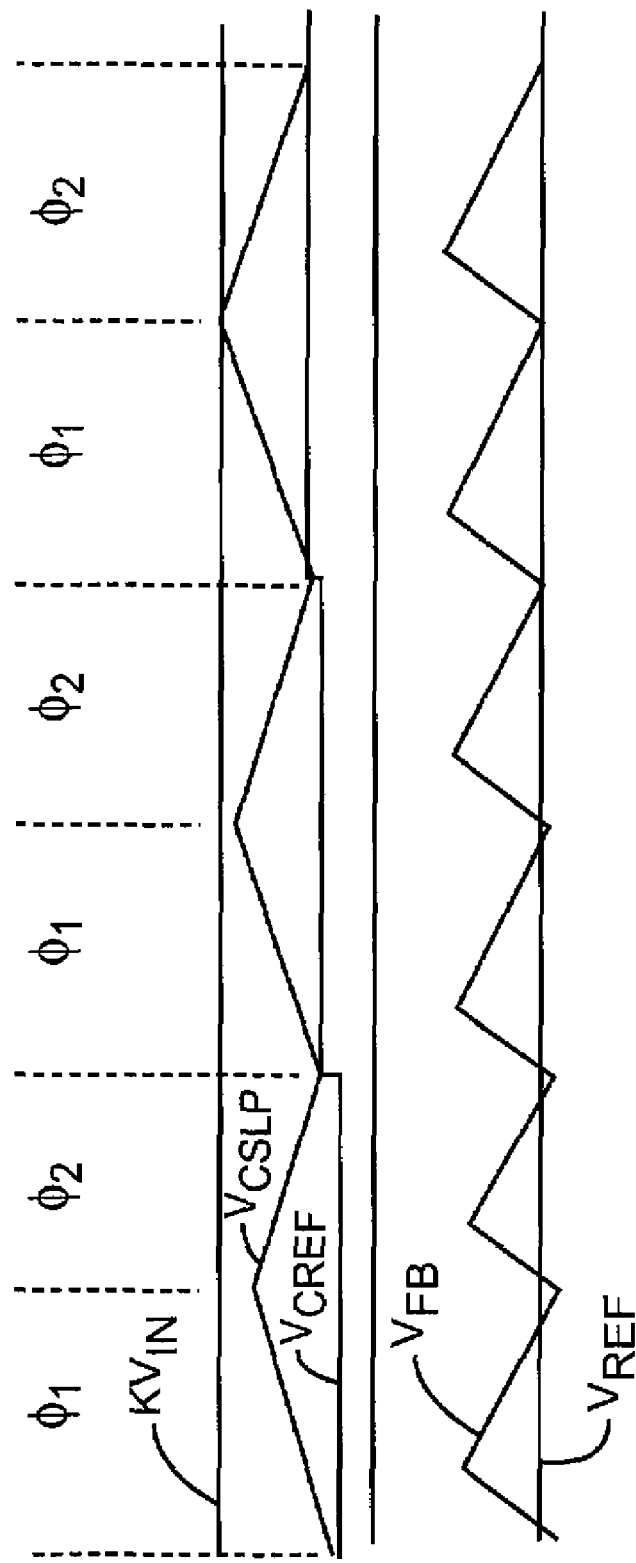
FIG. 6 is a waveform diagram of switching and control waveforms associated with operation of a constant on-time DC/DC converter implemented using the slope generator circuit of FIG. 5.

With the above in mind, FIG. 6 illustrates time domain signal waveforms for the multi-phase embodiment of the DC/DC converter 10. One sees that $V_{CSLP}$ (or, equivalently, the combined signal COMB_SIG as presented to the comparator 14) ramps up and down at the desired charge/discharge rate, and that the charge remaining on $C_{SLP}$ is transferred to $C_{REF}$ at each φ1-to-φ2 phase transition. As such, the voltage $V_{CREF}$ incrementally increases over successive switching cycles of the DC/DC converter 10. That increasing value of $V_{CREF}$ in turn incrementally adjusts the relative offset between the output feedback signal $V_{FB}$ and the regulation reference signal $V_{REF}$, such that the on-time switching decision point becomes more accurate over successive switching cycles of the DC/DC converter 10.

Whether the multi-phase embodiment of FIG. 5 is implemented, or whether a single-phase embodiment is implemented, such as shown in FIG. 3, the slope compensation teachings presented herein eliminate the need for complicated feedback networks in constant on-time converter circuits, and reduce output jitter from such converters. Further, the frequency variations that attend conventional constant on-time control are reduced by use of slope compensation. Under load transient conditions, the DC/DC controller 10, with its slope compensation, increases or decreases its switching frequency to better regulate the output voltage. Advantageously, the extent to which the switching frequency changes is reduced for the DC/DC controller 10, because of the added slope signal.

While such characteristics are a particular benefit for low ESR and/or low $C_{OUT}$ applications, they also benefit a wide variety of applications that require minimum variation in power supply switching frequency. The added slope signal effectively sets a minimum transient output voltage deviation required to respond to load steps. This minimum transient requirement starts large at the beginning of a switching cycle and reduces linearly to zero or some other desired minimum at the end of the switching cycle. Doing so preserves most of the DC/DC converter's transient response, while simultaneously reducing or eliminating high/low frequency bursts.

With the foregoing disclosure in mind, those skilled in the art will appreciate that the teachings herein provide for a DC/DC converter and associated method that provide for constant on-time control with added slope modulation, where the control may be pseudo fixed frequency constant on. Further, such control is based on slope compensation where the slope signal is a virtual representation of the output current from the DC/DC converter, or is a virtual representation of the converter's output inductor current, or is proportional to the input supply voltage of the DC/DC converter (i.e., an input feed-forward implementation). Such configurations, where capacitors and constant current sources may be used for slope signal generation, provide for constant on-time control with stable operation even where low ESR capacitors are used at the converter's output.

Of course, the present invention is not limited to the foregoing discussion and accompanying drawings. Instead, the present invention is limited only by the following claims and their legal equivalents.

What is claimed is:

1. A constant on-time DC/DC converter comprising:
    a regulation circuit including a comparator configured to trigger on-time switching of the DC/DC converter based on comparing an error signal with a slope signal;
    a combining circuit configured to generate the error signal based on an output feedback signal of the DC/DC converter and a regulation reference signal; and
    a slope generator circuit configured to generate the slope signal as a periodic signal that is synchronized with switching cycles of the DC/DC converter and ramps from a peak offset to a minimum offset during each cycle.

2. The constant on-time DC/DC converter of claim 1, wherein the regulation circuit includes a one-shot timing circuit that is configured to switch the DC/DC converter on for a time duration dependent on a ratio of output to input voltage for the DC/DC converter, in response to being triggered by the comparator.

3. The constant on-time DC/DC converter of claim 1, wherein the slope generator circuit comprises a transconductance circuit configured to generate the slope signal by charging and discharging a slope setting capacitor in synchronization with the switching cycles of the DC/DC converter.

4. The constant on-time DC/DC converter of claim 3, wherein the slope generator circuit is configured to charge the slope setting capacitor with a constant current that is proportional to the input supply voltage of the DC/DC converter.

5. The constant on-time DC/DC converter of claim 1, wherein the slope generator circuit is configured to generate the slope signal as a ramp current or voltage that tracks the off-time slope of switched inductor current for the DC/DC converter.

6. The constant on-time DC/DC converter of claim 1, wherein the slope generator circuit comprises a first transconductance circuit configured to charge a slope setting capacitor at a rate proportional to an input supply voltage of the DC/DC converter, and a second transconductance circuit configured to generate the slope signal responsive to a voltage of the slope setting capacitor.

7. The constant on-time DC/DC converter of claim 6, wherein the combining circuit comprises a third transconductance circuit configured to generate the error signal proportional to a difference between the output feedback signal and the regulation reference signal.

8. The constant on-time DC/DC converter of claim 6, comprising a reset circuit configured to discharge the slope setting capacitor in synchronization with on-time switching of the DC/DC converter.

9. The constant on-time DC/DC converter of claim 1, wherein the slope generator circuit generates the slope signal proportional to one of an input supply voltage of the DC/DC converter, inductor current in a switched inductor at an output of the DC/DC converter, or an output current of the DC/DC converter.

10. The constant on-time DC/DC converter of claim 1, wherein the slope generator circuit includes an output reference capacitor to store charge remaining on a slope setting capacitor in a prior switching cycle, for use in incrementally adjusting a relative offset of the slope signal.

11. The constant on-time DC/DC converter of claim 10, wherein the comparator is configured to compare a combined signal to a given reference signal and correspondingly to trigger a one-shot timer responsive to the combined signal falling below the given reference signal, said one-shot timer controlling the on time of the DC/DC converter.

12. The constant on-time DC/DC converter of claim 10, wherein the slope generator circuit is configured to generate the combined signal by summing first and second currents, said first current generated in a first switching phase proportional to the difference between a voltage proportional to the input supply voltage of the DC/DC converter and a slope setting capacitor voltage of the slope setting capacitor, and generated in a second switching phase proportional to the difference between the slope setting capacitor voltage and an output reference capacitor voltage of the output reference voltage capacitor in a subsequent second switching phase, said second current generated in the first and second switching phases proportional to the difference between the output feedback signal and the regulation reference signal.

13. The constant on-time DC/DC converter of claim 1, wherein the constant on-time DC/DC converter is configured to generate the slope signal to have a period equal to a switching period of the constant on-time DC/DC converter.

14. A method of operating a constant on-time DC/DC converter comprising:
    triggering on-time switching of the DC/DC converter based on comparing an error signal with a slope signal;
    generating the error signal based on an output feedback signal of the DC/DC converter and a regulation reference signal; and
    generating the slope signal as a periodic signal that is synchronized with switching cycles of the DC/DC converter and that ramps from a peak offset to a minimum offset during each cycle.

15. The method of claim 14, further comprising generating the slope signal via a constant charging current that is proportional to an input supply voltage of the DC/DC converter.

16. The method of claim 14, further comprising generating the slope signal by charging and discharging a slope setting capacitor in synchronization with the switching cycles of the DC/DC converter.

17. The method of claim 16, further comprising charging the slope setting capacitor with a constant charging current that is proportional to the input supply voltage of the DC/DC converter.

18. The method of claim 14, wherein generating the slope signal comprises generating the slope signal as a ramp current or voltage that tracks the off-time slope of switched inductor current for the DC/DC converter.

19. The method of claim 14, further comprising generating the slope signal via a first transconductance circuit configured to charge a slope setting capacitor at a rate proportional to an input supply voltage of the DC/DC converter, and a second transconductance circuit configured to generate the slope signal responsive to a voltage of the slope setting capacitor.

20. The method of claim 19, further comprising generating the error signal via a combining circuit that comprises a third transconductance circuit configured to generate the error signal proportional to a difference between the output feedback signal and the regulation reference signal.

21. The method of claim 19, further comprising resetting or otherwise discharging the slope setting capacitor in synchronization with on-time switching of the DC/DC converter via a reset switch.

22. The method of claim 14, wherein generating the slope signal comprises generating the slope signal proportional to one of an input supply voltage of the DC/DC converter, inductor current in a switched inductor at an output of the DC/DC converter, or an output current of the DC/DC converter.

23. The method of claim 14, further comprising referencing the slope signal to an output voltage of the DC/DC converter by, via an output reference capacitor, storing charge remaining on a slope setting capacitor in a prior switching cycle, for use in incrementally adjusting a relative offset of the slope signal.

24. The method of claim 23, wherein triggering the on-time switching of the DC/DC converter comprises comparing a combined signal to a given reference signal and correspondingly triggering a one-shot timer responsive to the combined signal falling below the given reference signal, said one-shot timer controlling the on time of the constant on-time DC/DC converter.

25. The method of claim 23, further comprising generating the combined signal by summing first and second currents, said first current generated in a first switching phase proportional to the difference between a voltage proportional to the input supply voltage of the constant on-time DC/DC converter and a slope setting capacitor voltage of the slope setting capacitor, and generated in a second switching phase proportional to the difference between the slope setting capacitor voltage and an output reference capacitor voltage of the output reference voltage capacitor in a subsequent second switching phase, said second current generated in the first and second switching phases proportional to the difference between the output feedback signal and the regulation reference signal.

* * * * *